United States Patent [19]

Ehlig et al.

[11] Patent Number: 5,109,494
[45] Date of Patent: Apr. 28, 1992

[54] PASSIVE PROCESSOR COMMUNICATIONS INTERFACE

[75] Inventors: Peter N. Ehlig; Roger W. Peters, both of Houston, Tex.

[73] Assignee: Texas Instruments Incorporated, Dallas, Tex.

[21] Appl. No.: 541,446

[22] Filed: Jun. 22, 1990

Related U.S. Application Data

[63] Continuation of Ser. No. 140,055, Dec. 31, 1987, abandoned.

[51] Int. Cl.⁵ .............................................. G06F 13/00
[52] U.S. Cl. ................... 395/325; 364/239; 364/240.2; 364/247.4; 364/238
[58] Field of Search ... 364/200 MS File, 900 MS File

[56] References Cited

U.S. PATENT DOCUMENTS

| | | | |
|---|---|---|---|
| 4,112,490 | 9/1978 | Pohlman et al. | 364/200 |
| 4,159,516 | 6/1979 | Henrion et al. | 364/200 |
| 4,234,919 | 11/1980 | Bruce et al. | 364/200 |
| 4,263,650 | 4/1981 | Bennett et al. | 364/200 |
| 4,315,308 | 2/1982 | Jackson | 364/200 |
| 4,514,808 | 4/1985 | Murayama et al. | 364/200 |
| 4,563,736 | 1/1986 | Boudreau et al. | 364/200 |
| 4,638,451 | 1/1987 | Hester et al. | 364/900 |
| 4,744,023 | 5/1988 | Welsh | 364/200 |

OTHER PUBLICATIONS

"56-Bit General Purpose Digital Signal Processor", Motorola DSP56001, pp. 1-25, 1986.

Primary Examiner—Michael R. Fleming
Assistant Examiner—Debra A. Chun
Attorney, Agent, or Firm—James F. Hollander; René E. Grossman; Richard L. Donaldson

[57] ABSTRACT

A passive interface between a processor and a peripheral device is shown. The peripheral device could also be another processor. The interface allows asynchronous communication between the devices. Speed limitations are minimized as the processor has the ability within the interface to know when it can send data, and when it has received data. The number of interface pins is also minimized. Also, communication between devices can still be performed even if the devices have different data bus widths.

19 Claims, 7 Drawing Sheets

PASSIVE PROCESSOR COMMUNICATIONS INTERFACE

This application is a continuation, of application Ser. No. 07/140,055, filed Dec. 31, 1987, now abandoned.

BACKGROUND AND SUMMARY OF THE INVENTION

This invention is in the field of microcomputers and microprocessors. More specifically, it is in the area of interfacing peripheral devices and/or other processors to the microcomputer or microprocessor.

A rapidly accelerating trend in the electronics industry is the increased demand for fast computational abilities. To try to meet this demand, the industry has introduced families of digital signal processing microcomputers, high-speed conventional microprocessors, and other fast processors. It is becoming apparent that one of the major bottlenecks in pushing for still higher speed is getting data in and out of the processor itself.

The industry has tried numerous approaches to solve this problem when memory access is the issue. Techniques such as pipelining, cacheing, etc. have been successfully employed. However one area that has not been adequately addressed is that of I/O to remote (i.e. off-chip) devices.

It is an object of the present invention to avoid creating an I/O bottleneck.

The vast majority of systems have a hardwired type of handshake between the microprocessor/microcomputer and the peripheral device. This handshake generally requires the processor to wait until the other device is ready during a read or a write operation. This in turn usually means that the reads and/or writes must be synchronous with the system clock.

It is an object of the present invention to allow a handshaking protocol, without forcing the processor to wait for the other device.

It is also an object of the invention to allow asynchronous reads and writes.

Asynchronous interfaces that have been developed have required several control lines to operate. This requires that the integrated circuit have more pins (increasing costs). This also adds complexity to the interface.

It is an object of the invention to minimize the number of control lines required for reads and writes.

It is also an object of the invention to simplify the interface mechanism.

Current I/O interfaces are designed to operated with fixed bus widths. If a processor has a 16 bit data bus, then peripherals are expected to be 16 bits in data width. This limits the number of devices that can be attached. In addition, if a 16 bit processor wishes to communicate with an 8 bit processor, added external logic is required.

It is an object of the invention to allow the processor to communicate with peripheral devices having varying data bus widths.

It is also an object of the invention to allow different processors having different data bus widths to communicate in a simple manner.

It is a further object of the invention to allow interface communications to occur with minimal external logic.

Asynchronous communications introduce certain problems. The receiving processor must usually poll its inputs to see when valid data is present. This slows the processor down as it must continually ask. In processors that do not have to poll the receive buffer, an interrupt is normally provided that must be triggered by the sending processor. However this takes an additional external pin, plus additional system design to implement.

It is an object of the invention to provide a mechanism for alerting a receiving processor when it has received data.

It is a further object of the invention to provide this mechanism without having to add an external interrupt pin.

It is also an object of the invention to minimize system design overhead by eliminating the requirement that the transmitting processor explicitly generates interrupts to the receiving processor.

A similar situation occurs on the transmitting side. When the processor wishes to transfer data, it needs to know when the receiving device is available. Further, the transmitting processor should be able to tell when the receiving device has read the last data transmitted.

It is an object of the invention to inform the transmitting processor when it is free to transmit data.

It is also an object of the invention to allow the transmitting processor to know when the prior transmitted data has been read.

In some cases, it is desirable for the processor to operate in a master mode. This means that all communications occur in response to the processor's initiation. Conversely, there are situations where the processor should act as a slave to another system master It is an object of the invention to allow the interface to be able to function in either a master or a slave environment.

These and other objects of the invention are achieved by a communications system comprising:

a peripheral device in communications over a data bus with a processor;

said data bus also including a receive control line and a transmit control line, each said line having a first and second state;

said processor having reception and transmission registers selectively coupled to said data bus for the reception and transmission of data;

said peripheral device controlling said receive control line wherein said data is latched into said reception register when said receive control line state is changed from said first state to said second state, and wherein said processor is selectively interrupted when said receive control line state is changed said first state to said second state;

said peripheral device controlling said transmit control line wherein said data is placed onto said data bus from said transmission register when said transmit control line moves from said first state to said second state; and said processor selectively changing the data in said transmission register after said transmit control line moves from said second state to said first state.

DETAILED DESCRIPTION

Figure 1:
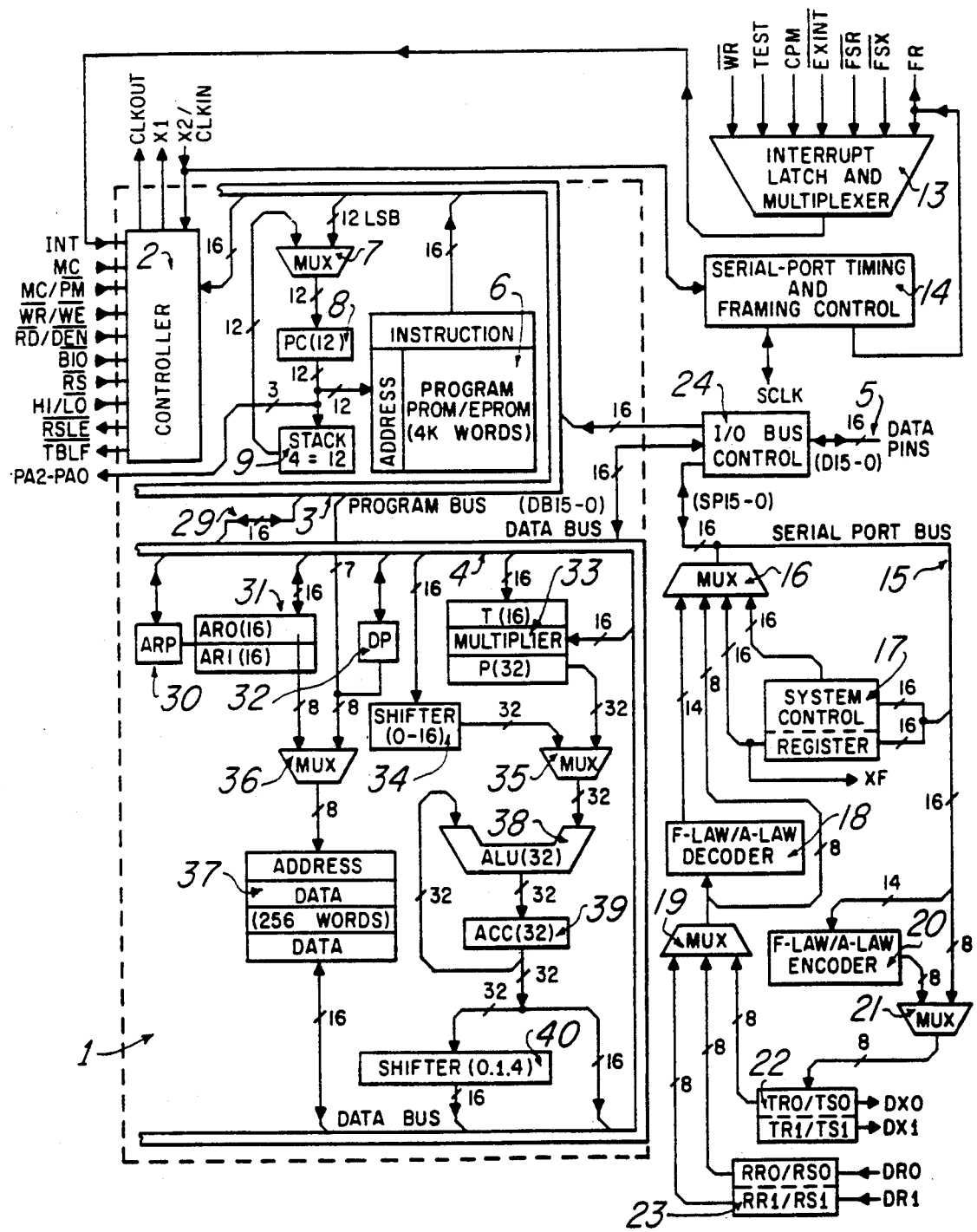
FIG. 1 is a block diagram of the processor employing the present invention.

FIG. 1 shows a simplified schematic of a processor employing the present invention. Block 1 represents the portion of the processor that composes a complete microcomputer such as a TMS320C15 manufactured by Texas Instruments, Inc. of Dallas, Tx. The architecture of this microcomputer is known as a modified Harvard architecture in that it has a bus for data and a separate bus for program memory. Cross-connect (29) allows data to move from the program bus (3) to the data bus (4) and vice-versa. This is what differentiates this architecture from a "pure" Harvard type. The remainder of the diagram represents additional peripheral circuitry located on-chip for speed and logic simplification purposes.

The control aspects of the processor are handled by the components generally surrounded by the program bus (3). These consist of the controller (2), multiplexor (7), program counter (8), stack (9), and program memory (6). In operation, the program counter (8) contains a 12 bit address of the instruction word to be used. This address is input to the addressing portion of program memory (6) causing the memory word to be retrieved and output onto program bus (3). The retrieved memory word is 16 bits. This in turn is input into the controller (2) for decode and execution. It should also be noted that the three least significant bits (LSB) of the address may also be output on lines PA2-PA0. The function of these, as well as other I/O of the controller (2), will be discussed later.

The multiplexor (7) is used to select an address from the program bus (3) or from the stack (9). The stack (9) is used for changing the instruction address in response to interrupts and/or subroutine returns.

Instructions for the controller (2) may also be loaded onto the program bus (3) from the I/O bus control (24). Data (D15-D0) is input to I/O bus control (24) from I/O bus (5). The ability to feed instructions onto program bus (3) from an external source is a feature of the invention that will be discussed below. I/O bus control (24) also serves to allow output and input of data between I/O bus (5), serial port bus (15) and data bus (4). Not shown in this figure are the control lines used by I/O bus control (24). These will be discussed in FIG. 5.

Calculations on data performed in the microcomputer portion (1) of the processor are handled by the components generally bounded by the data bus (4). Data for the operations is contained in the data memory (37). The address for the data in data memory (37) input from the multiplexor (36). Multiplexor (36) selects the address from either one of the auxiliary registers (31) pointed to by the auxiliary register pointer (30), or from a seven bit address from the program bus (3) along with a data page pointer (32). The auxiliary registers (31) may also serve as loop control counters for repetitive instructions.

Data to be operated on flows through either the multiplier unit (33) or through the barrel shifter (34). Multiplexor (35) is used to select which result is to be fed into the arithmetic logic unit (ALU)(38). Also used as an input to the ALU (38) is the output from the accumulator (39). The result from ALU (38) is output to the accumulator (39). The accumulator (39) may then place the data onto the data bus (4) or into the parallel shifter (40).

As microcomputers have become more powerful, it has become more advantageous to include certain peripheral circuitry on the same chip. Particularly in high volumes, this can lead to a much more cost-effective approach for system design. In addition, by having the peripherals on-chip, performance may be enhanced as there are fewer (and faster) buffers involved. This leads to application specific types of microcomputers. The presently preferred embodiment of the invention is employed in such a device. It should be noted that the invention is not dependent on being used as an on-chip peripheral. In some embodiments, the invention may be located off chip. In other embodiments, the invention may be integral with the microcomputer or microprocessor itself.

On-chip with the microcomputer discussed above, are several peripherals. First is a serial port with companding functions. There is also a set of parallel ports and a passive co-processor interface. As will be explained, the passive co-processor interface uses the parallel ports and some other control lines to accomplish its functions.

The serial port consists of serial port receive registers (23), serial port transmit registers (22), multiplexors (21, 19, and 16), a decoder (18), an encoder (20), and a serial port controller (14). The two system control registers (17) are loaded from the I/O bus control (24) via serial port bus (15). As will be discussed, these two registers (17) are addressed by outputs PA2-PA0. In addition, there is a serial port timing and framing control block (14). SCLK is the serial port clock. DX0 and DX1 are the two serial port outputs while DR0 and DR1 are the serial port inputs.

CLKOUT is the system clock output. X2/CLKIN is the crystal input for the internal oscillator or may be an external oscillator system clock input. X1 serves as the crystal output for the internal oscillator.

In the present embodiment of the invention, there is a single interrupt (INT) that is used by the controller (2). However the functionality of interrupt (INT) is governed by the interrupt latch and multiplexor (13). As will be discussed when describing FIG. 5, considerable flexibility can be obtained. It should be noted that the internal interrupt (INT) is not an input from an external pin. The external inputs are input into the interrupt latch and multiplexor (13). These include EXINT__, FSR__, and FSX__.

Two inputs to the controller (2) are used to select various modes of the processor. These inputs (MC and MC/PM__) limit the number of possible modes to 4. While the present embodiment of the invention only uses these four modes, it should be understood by those skilled in the art that additional pins could be used if more modes were desired. In the presently preferred embodiment of the invention, these four modes are microcomputer (or normal mode), coprocessor, test, and emulator. The emulator mode has been fully described in co-pending application Ser. No. 07/093,463 and is incorporated herein by reference.

Controller (2) decodes the MC and MC/PM__ inputs and generates three additional control signals. Two of these signals (TEST and CPM) also serve as inputs to the interrupt latch and multiplexor (13). The third signal (EMU) will be discussed when describing FIG. 4.

EXINT— is the normal interrupt input. However, as will be discussed later, in some modes of the processor of the presently preferred embodiment of the invention, this input is disabled from being driven externally. FSR— is an input for the external receive serial port. FSX— is an input for the external transmit serial port. FR, as can been seen in FIG. 1, is both an output from the internal serial port for framing control (via serial port timing and framing control 14), and is also an input to the interrupt latch and multiplexor (13).

The other inputs to the controller (2) that are input from the external pins of the integrated circuit will now be discussed. The BIO— input is used as a pollable input so that the processor can know when an external event has happened. Similar to EXINT— discussed above, in some processor modes this input is disabled from being driven from an external device. However it is driven internally.

Likewise, the pin definitions for other inputs change depending on the processor mode. The WR—/WE— input serves as an external write control for the internal input latch when in coprocessor mode, but serves as the write enable for data when in the normal microcomputer mode. The RD—/DEN— input serves as the external read control for the output latch when in coprocessor mode and serves as the data enable for an external device read when in normal microcomputer mode.

The three output signals PA0, PA1, and PA2 serve as port select addresses. As stated earlier, the present embodiment of the processor of the invention has a set of parallel output ports. These three output lines allow a maximum of eight ports to be addressed. In the presently preferred embodiment of the processor, the allocation of the eight ports is six for the parallel ports and two for the system control registers (17). The system control registers (17) also handle the serial port functions.

However, in the coprocessor mode, these control lines (PA2-PA0) are used for other functions. PA0 turns into an input pin called HI/LO—. The function of this pin will become clearer in the description of FIG. 4. The PA1 output becomes the RBLE— output pin. This is used to signify that the receive buffer latch is empty. Similarly, the PA2 output becomes the TBLF— output pin and is used to indicate that the transmit buffer latch is full. The use of these pins will become clearer when the coprocessor mode is discussed.

Figure 2:
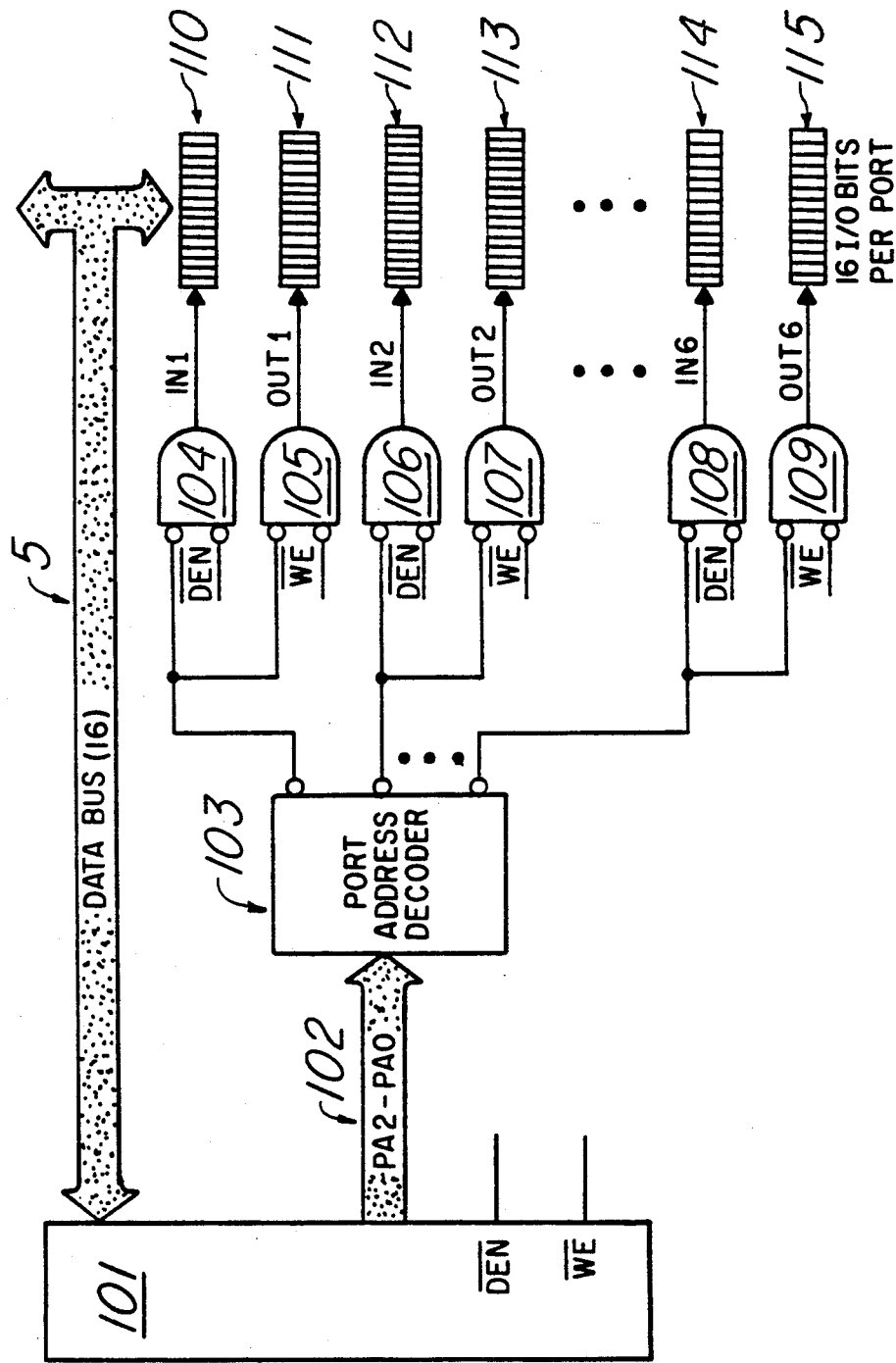
FIG. 2 illustrates how the parallel ports operate.

To better understand the differences between the normal microcomputer mode and the coprocessor mode, FIGS. 2 and 3 will be used. FIG. 2 illustrates the way in which the port select addresses (PA2-PA0) are used. Processor 101 encompasses the processor illustrated in FIG. 1 above. External data bus (5) is the continuation beyond the data pins as shown in FIG. 1. The port select bus (102) has the port select addresses PA2-PA0. These are decoded by the port address decoder (103) which may, for example be a 74LS137 as manufactured by Texas Instruments, Inc. of Dallas, Tx.

AND gates (104-109) are selected by the port address decoder (103). When the appropriate strobe is also received (either data enable DEN— or write enable WE—), then the desired data (blocks 110-115) is latched onto, or taken from the 16 bit data bus (5). Thus, I/O is treated as a memory mapped device.

This method of data transfer is well known in the art. However, there are some disadvantages to it. The biggest problem is that the peripheral device must keep up with the processor. If it does not, then the processor is forced to wait. In high-speed environments, this is unacceptable.

The present invention employs an additional mode of data transfer. This is known as the coprocessor mode. It should be noted that while the presently preferred embodiment of the invention uses this mode for data transfer between different processors of varying speed, the invention is not limited to this. In many cases the invention will be used where any slow peripheral is employed. The processor can continue at full speed doing another task. When the peripheral has the data, or requires data, the processor can then respond. It does not have to wait for the data as in conventional systems As was illustrated above, the conventional method of data transfer assumes that the data coming in is 16 bits in parallel. This is not always the case. For example, some 16 bit processors (such as the INTEL 8088) use an eight bit bus even while transferring 16 bit data. In the conventional scheme above, this presents some additional logic that must be added. In contrast, the present invention allows different widths to be used for coprocessor mode than for normal data transfer. This is the function of the HI/LO— pin mentioned earlier. Thus, the coprocessor port of the present embodiment of the invention provides a direct interface to most 4/8-bit microcomputers and 16/32 bit microprocessors.

In the presently preferred embodiment of the invention, the port is accessed through I/O port 5 using IN and OUT instructions. The coprocessor interface allows the device to act as a peripheral (slave) microcomputer to a microprocessor, or as a master to a peripheral microcomputer such as the TMS7042. The coprocessor port is enabled by setting MC/PM— and MC to low. The microcomputer mode is enabled by setting these two pins high.

Thus the processor can instantly be reconfigured between these two modes. As mentioned earlier, the test and emulation modes can also be instantly switched to. This multi-mode capability has several advantages. First, the processor can be functioning as a conventional microcomputer where it is communicating with high-speed peripherals. When it needs to communicate to slower devices, or a device with a different data width size, it can instantly switch (or be switched by the slower device) into the coprocessor mode. Secondly, because many pin functions can be instantly changed by the invention, a product line can be upgraded to an enhanced processor without losing pin compatibility with the old processor. Third, a manufacturer does not have to build multiple parts with different I/O structures. This allows the vendor to sell the same product to multiple clients (with differing needs) thus increasing volume and lowering costs. The advantages to also being able to switch to test or emulation modes, while discussed later, additionally serve to reduce cost.

In coprocessor mode, the 16-bit data bus is reconfigured to operate as a 16-bit latched bus interface. In the presently preferred embodiment of the invention, control bit 30 (CR30) in system control register 1 (17 of FIG. 1) is used to configure the coprocessor port to either an 8-bit or a 16-bit width for data transfer. When CR30 is high, the coprocessor port is 16 bits wide, thereby making all 16 bits of the data port available for 16-bit transfers to 16/32-bit microprocessors. When CR30 is low, the port is 8 bits wide and mapped to the low byte of the data port for interfacing to 4/8 bit microcomputers. When operating in the 8 bit mode, both halves of the 16 bit latch can be addressed by the external device using the HI/LO_ pin (301 of FIG. 3A and 305 of FIG. 3B), thus allowing the 16-bit transfers over 8 data lines. This requires two external bus cycles but only one internal port access. When not in the coprocessor mode, port 5 can be used as a generic I/O port.

Figure 3A:
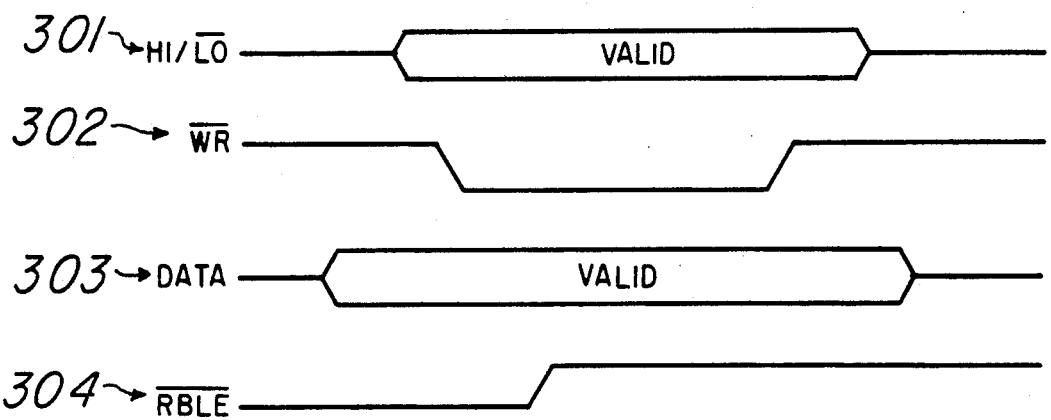
FIGS. 3A and 3B shows the timing diagrams for the coprocessor mode.
Figure 3B:
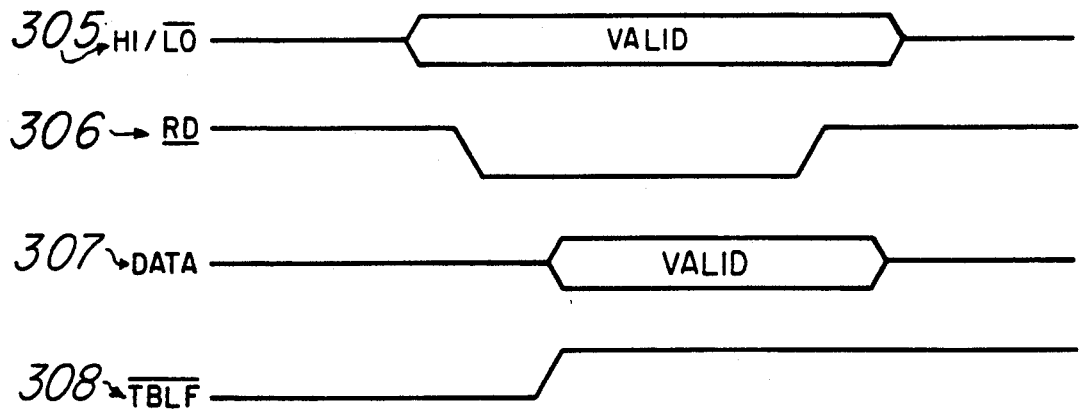

Interprocessor (or between processor and device) communication through the coprocessor interface is accomplished asynchronously as in memory-mapped I/O operations. This is illustrated in FIGS. 3A and 3B. For a write to the presently preferred embodiment of the processor, the external processor lowers the WR_ line (302) and places data (303) on the bus (5 of FIG. 1). It then raises the WR_ line (302) to clock the data into the on-chip latch. The falling edge of WR_ (302) clears the RBLE_ (receive buffer latch empty) flag (304), and the rising edge of WR_ (302) automatically creates the equivalent of an EXINT_ interrupt to the processor. Note that when reading or writing in the 8 bit mode, accesses to the high byte will not activate an interrupt or BIO_.

Turning to FIG. 3B, the external processor reads from the latch by driving the RD_ line (306) active low, thus enabling the output latch to drive the latched data (307). When the data (307) has been read, the external device will again bring the RD_ line (306) high. This activates the internal BIO_ line (of FIG. 1) to signal that the transfer is complete and the latch is available for the next transfer. The falling edge of RD_ (306) resets the TBLF_ (transmit buffer latch full) flag (308). Note that, as discussed above, the EXINT_ and BIO_ lines are reserved for coprocessor interface and cannot be driven externally when in the coprocessor mode.

Figure 4A:
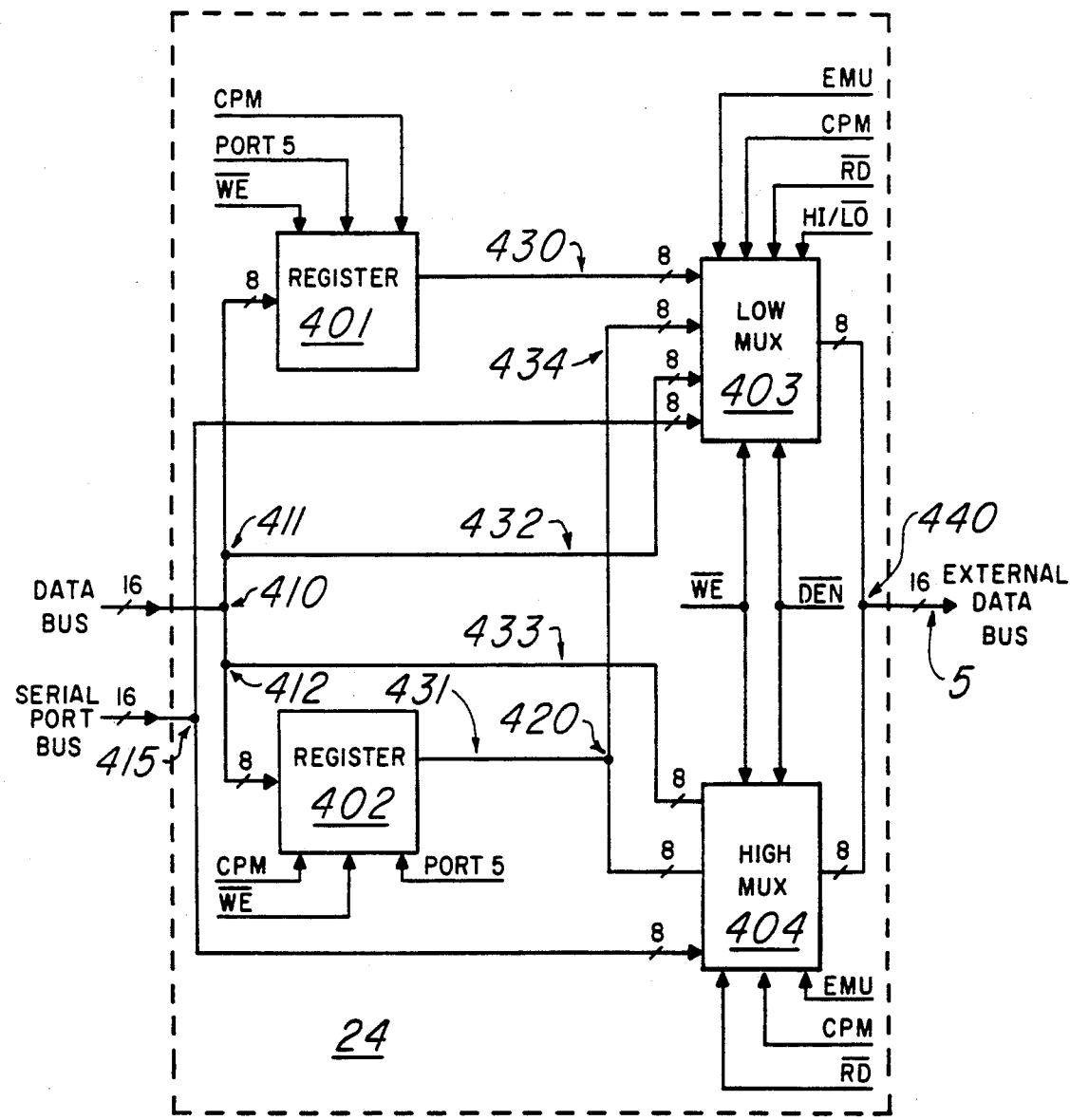
FIG. 4A shows the output structure of the I/O bus control.

FIG. 4A illustrates the internal configuration of the I/O bus control (24 of FIG. 1) when it is set for output. In the presently preferred embodiment, the I/O bus control comprises 4 major components. There are two 8 bit registers (401 and 402) used for the coprocessor mode, and two 8 bit multiplexors (403 and 404) used in all modes. It should be noted that the signal names given are those that are used internally. Consequently one should not get confused when seeing two different signal names that represent a common pin (for example RD_ and DEN_). If the processor is not in the right mode for these signals to be used, they are ignored.

Data can come into the I/O bus control either from the serial port bus or from the internal data bus. In either event, these are 16 bit buses.

At 415 and 410, the serial port bus and the data bus respectively bifurcate into two 8 bit buses (one for the high-order bits and one for the low order bits). This is done because the external data bus (5) can operate in an 8 bit fashion when in coprocessor mode. Tracing the serial port bus first, it can be seen that the low order bits go into the low multiplexor (403) and the high order bits go into the high multiplexor (404). When the DEN_ signal goes active, the data is output from the multiplexors (403 and 404), combined back into 16 bit wide data, and output on external data bus (5). In the presently preferred embodiment of the invention, the DEN_ signal is allowed to control the serial data output only when in the emulator or normal microcomputer mode.

Data from the data bus has a more complex path. At points 411 and 412, the data bus data is routed to both the registers (401 and 402) and to the multiplexors (403 and 404). If the processor is in either the normal microcomputer mode or test mode, then the multiplexors (403 and 404) will select the data from buses 432 and 433. The WE_ signal is then used to place the data onto the external data bus (5) as above.

If the coprocessor mode is selected (CPM active) and the correct port is selected (PORT5), the data will be input to the registers (401 and 402). Upon the internal write enable (WE_) generated by an OUT instruction, data will be placed onto buses 430 and 431. Since CPM is active, the multiplexors (403 and 404) will look for data on these buses. In 16 bit mode, the RD_ signal will then place the data onto the external data bus (5) as above.

However, if the 8 bit mode is selected, then data can only appear on the low order 8 bits of external data bus (5). The external processor changes the state of the HI/LO_ input to low multiplexor (403). This causes the multiplexor (403) to read the high order bits that were also placed on bus 434 and output them to external data bus (5). While other mechanisms are possible, in the present embodiment of the invention, the high order byte is read first by asserting RD_ low, then RD_ is brought back high. Following is the read of the low order byte into multiplexor (403) which is done by first switching HI/LO_ and then reasserting RD_ as low. The switching of RD_ back to high relinquishes control of the buses.

The emulation signal (EMU) is used to output the serial port bus contents onto the external data bus (5). This mode is designed so as to allow real-time emulation of the processor and testing of the serial port operation. As stated above, this feature is covered fully in copending application Ser. No. 07/093,463 which is incorporated herein by reference.

Figure 4B:
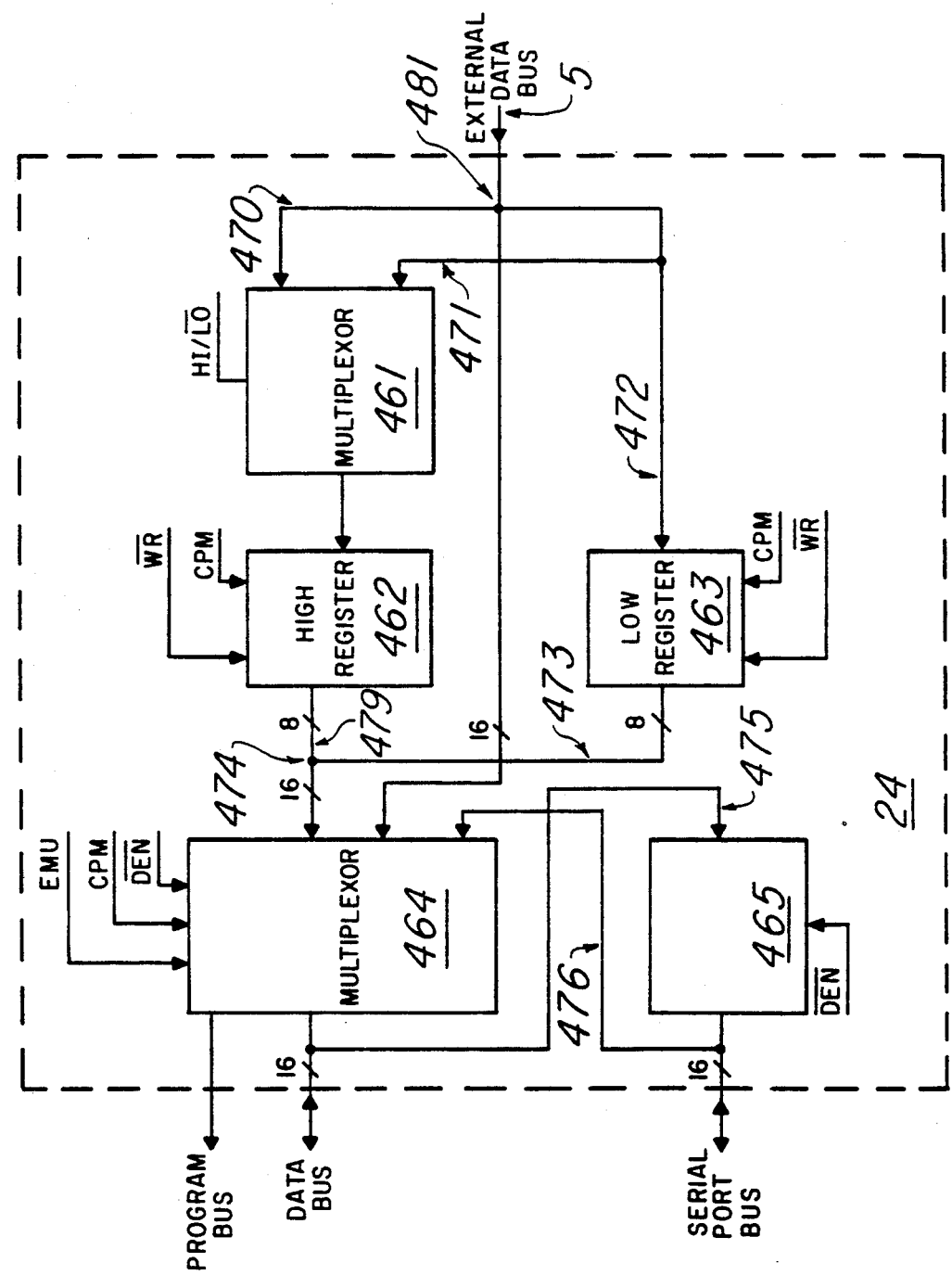
FIG. 4B shows the input structure of the I/O bus control.

FIG. 4B illustrates the structure of the I/O bus control block (24) when used in input mode. Data paths are easily followed when in normal microcomputer mode or when in emulation mode. In these cases, data (16 bits wide) comes in from external data bus (5) and arrives at multiplexor (464). In microcomputer mode, the DEN_ signal is used to place data from bus 5 onto the data bus. If in emulation mode (EMU active), then the data is either routed to the program bus (if DEN_ is high) or to the data bus (if DEN_ is low).

Again, in coprocessor mode, the routing is more complex. For a 16 bit mode, incoming data on bus (5) is bifurcated at point 481 into low order bits (on bus 472) and high-order bits (on bus 470). Data on bus 472 is allowed to enter the low register (463) as CPM is active. Similarly, multiplexor (461) will allow data on bus 470 to enter high register (462). Upon signal from WR_, the data is output onto the respective output buses (473 and 479) where it is combined back into a 16 bit path (474). This then enters multiplexor (464).

For eight bit transfers from the external data bus (5), the HI/LO_ signal is used to reroute the actual high-order bits back from the low-order bus (472) via bus (471) and multiplexor (461). The rest of the transfer is the same.

Multiplexor (464) also includes some additional logic that is used to decide which of its inputs (474, 476, or 481) to use. This is based on which port has been addressed. When in coprocessor mode, where port 5 is the normal port, ports 1 and 2 can also be addressed. This is because they represent on-chip peripherals (in this case the system control registers). When multiplexor (464)

detects these two ports as being addressed, multiplexor (464) will select bus 476 as the input and route data onto the data bus. In this way, data can be transferred from the serial port bus to the data bus. Similarly, when port 5 is selected, multiplexor 464 will select bus 474 as the input to be passed onto the data bus.

Data is transferred from the data bus to the serial port bus by operation of bus (475) and tri-state driver block (465). When the DEN_ signal is low, the driver (465) is turned off and will not allow data on bus 475 to be transferred. When the DEN_ signal is high, data is allowed to flow from the data bus to the serial port data bus.

Figure 5:
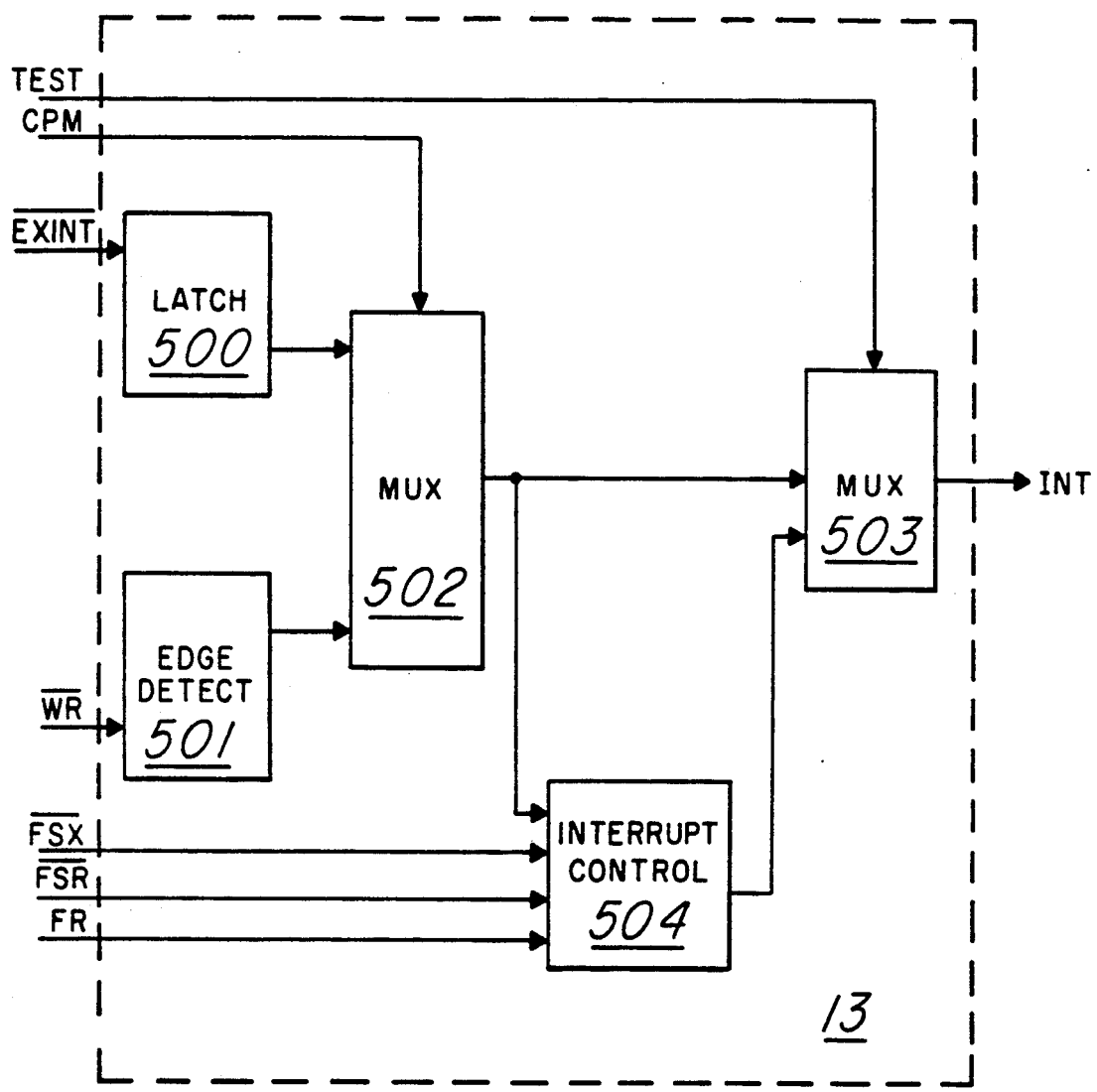
FIG. 5 is a block diagram of the interrupt latch and multiplexor block.
Figure 6:
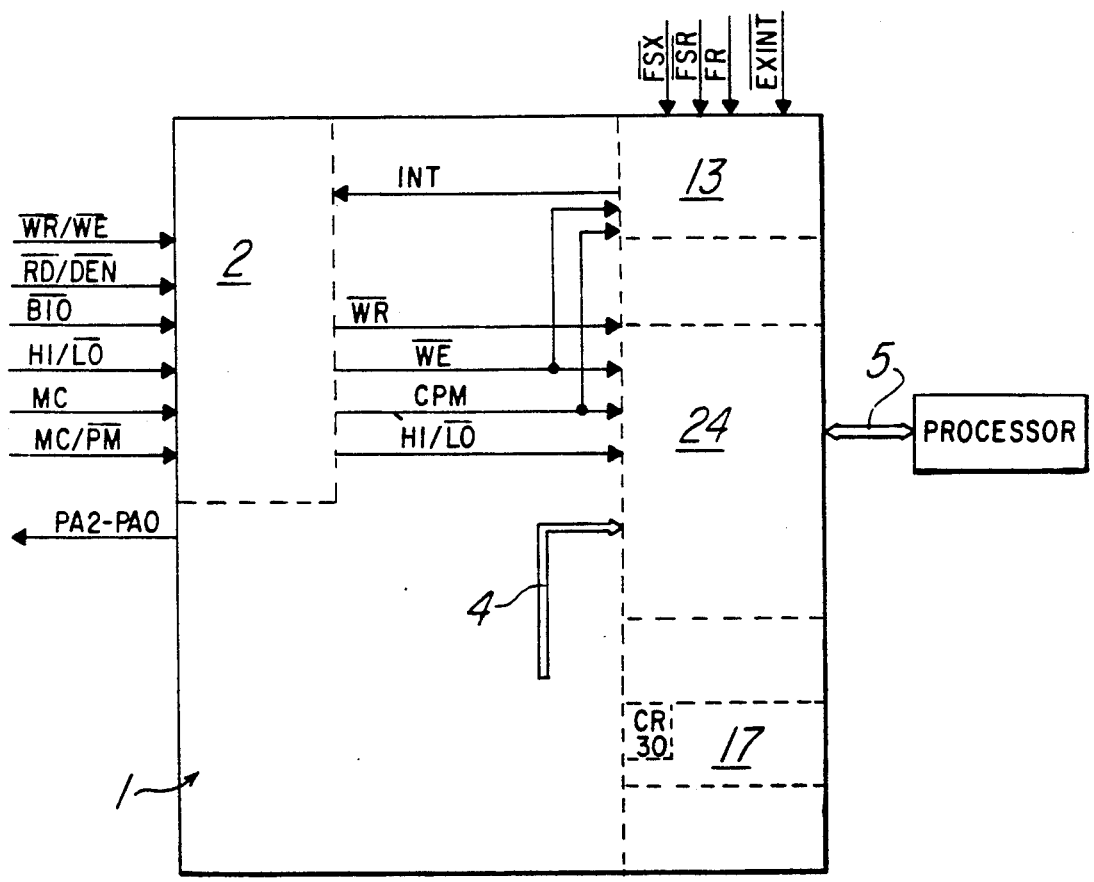
FIG. 6 is a schematic diagram showing the connection of a processor according to the invention with an external processor.

FIG. 5 illustrates the internal operation of the interrupt latch and multiplexor (13 of FIG. 1). The normal external interrupt (EXINT_) is latched into latch (500). This in turn is input to multiplexor (502). The other input to the multiplexor (502) is derived from the WR_ signal. As was discussed previously, in coprocessor mode, the system relies on detecting the transition of WR_. Therefore the edge detection circuit (501) is employed. The CPM signal (which signifies whether the processor is in coprocessor mode or not) is used to select which signal (EXINT_ or the edge detection from WR_) is output. This is also why the EXINT_ signal is disconnected in coprocessor mode.

Three additional potential interrupt signals are also provided for. These are the FSX_ signal, the FSR_ signal, and the FR signal. All of these relate to the serial port of the present embodiment of the processor. These signals, plus the output from multiplexor (502) are input to the interrupt control (504). This block allows the user to select (via a mask) which interrupts he would like to be interrupted on.

A primary rationale for the invention is cost reduction. This has been achieved by allowing back-compatibility with older processors. The TEST input in to the interrupt latch and multiplexor is another example of this. In older generations of products, certain features may not be present. However extensive test patterns have been developed. The present invention allows these patterns to be used on later generation products.

In order to use these patterns, timing must be identical to the older generations. The TEST input controlling multiplexor (503) does this. Prior generations did not have the added interrupt control functions. Therefore, when TEST is activated, these functions are bypassed.

This same technique could be used to bypass major logic sections, add some slower circuitry if necessary, change pin configurations, or otherwise eliminate incompatibility. This sharply reduces the cost to the vendor as he does not have to generate new test patterns. In addition, it ensures that the customer can have an exact replacement part, even several generations later. Further, the customer is ensured of no incompatibilities that may escape new and different test patterns.

While certain presently preferred embodiments of the invention have been discussed, these are intended merely as illustrative. Other embodiments of the invention are possible without departing from the scope of the invention. All limitations are set out in the claims below.

What is claimed is:

1. A device comprising:
   a processor and a communications interface, said interface including:
   an internal data bus connecting said processor and said communications interface and adapted to coupling data on an external data bus to said internal data bus;
   an internal control line adapted to couple to an external control line for receiving a control signal having first and second states;
   a data register coupled to said internal data bus for receiving data from the external data bus;
   said data register latching said data when said control signal moves from said first state to said second state; and
   said processor of being selectively interrupted when said control signal moves from said first state to said second state.

2. The device claimed in claim 1 further comprising:
   an edge detector for generating a transition signal in response to said control signal moving from said first state to said second state wherein said transition signal is used as an interrupt input to said processor.

3. The device claimed in claim 2 further comprising an interrupt controller wherein said interrupt controller selectively masks said interrupt input.

4. The device claimed in claim 1 wherein said processor selectively reloads said data register when said control signal is in said second state.

5. The device claimed in claim 4 further comprising:
   circuitry for generating an internal signal in response to said control signal moving from said first state to said second state, wherein said internal signal is polled by said processor to determine when said processor may reload said data register.

6. A communications system comprising:
   a data bus and a processor connected to said data bus;
   a peripheral device in communication over said data bus with said processor;
   said data bus also including a receive control line and a transmit control line, each said line having a first and second state;
   said processor having reception and transmission registers selectively coupled to said data bus for the reception and transmission of data;
   said peripheral device controlling said receive control line wherein said data is latched into said reception register when said receive control line state is changed from said first state to said second state, and wherein said processor is selectively interrupted when said receive control line state is changed from said first state to said second state;
   said peripheral device controlling said transmit control line wherein said data is placed onto said data bus from said transmission register when said transmit control line moves from said first state to said second state; and
   said processor selectively changing the data in said transmission register after said transmit control line moves from said second state to said first state.

7. The communication system as claimed in claim 6 wherein said peripheral device includes another processor.

8. The communication system as claimed in claim 6 wherein said peripheral device has a different data bus width than said processor.

9. An electronic system comprising a data processing device including a reception register, a data bus with a control line, and a peripheral device connected by said data bus to said data processing device, said peripheral device adapted to send data to said data processing device via said data bus and send a control signal that changes state via said control line so that the data is latched into the reception register when the control signal changes from a first state to a second state and interrupts said data processing device when the control signal moves from the first state to the second state.

10. The electronic system claimed in claim 9 wherein said data processing device further includes a processor circuit and an interrupt controller coupled to said control line.

11. The electronic system claimed in claim 9 wherein said control line is a write line.

12. The electronic system claimed in claim 9 wherein said data processing device further includes a processing circuit and an edge detector that generates a transition signal in response to said control signal moving from said first state to said second state wherein said transition signal is used as an interrupt input to said processing circuit.

13. The electronic system claimed in claim 9 wherein said peripheral device includes another data processing device.

14. The electronic system claimed in claim 9 wherein said data processing device further includes a transmission register selectively coupled to said data bus for the transmission of data to said peripheral device.

15. The electronic system claimed in claim 14 wherein said data bus also includes a transmit control line and said peripheral device is adapted to control said transmit control line so that data is placed onto said data bus from said transmission register when said transmit control line moves from a first state to a second state.

16. The electronic system claimed in claim 15 wherein said data processing device includes a circuit to change the data in said transmission register after said transmit control line moves from said second state to said first state.

17. A method of operating a communications system having a data bus with a control line, a processor with a reception register connected to the data bus and a peripheral device connected by the data bus to the processor, the method comprising the steps of:

sending data via the data bus and sending a control signal that changes state from the peripheral device via the control line so that the data is latched into the reception register when the control signal changes from a first state to a second state; and interrupting the processor when the control signal moves from the first state to the second state.

18. The method of claim 17 further including a step of reloading a data register in response to the interrupting step when the control signal is in the second state.

19. An electronic apparatus comprising:

a first processor;

a second processor;

a communications interface, for providing variable bus width data transfer between said firs processor and said second processor;

a first data bus connected between said first processor and said communications interface; and a second data bus connected between said second processor and said communications interface;

wherein said communication interface comprises:

data transfer width control circuitry responsive to said first processor to establish a transfer width in response to said first processor; and at least one data latch connected to said width control circuitry and said first data bus and said second data bus for storing data in transit; and wherein data is transferred at least one multiplexer responsive to said first processor nd connected to said second data bus and to said at least one data latch for selecting contents from said data latch for output onto said second data bus with a transfer width compatible with the width of the receiving data bus and established by said data transfer width control circuitry.

* * * * *